United States Patent
Yamamoto et al.

[11] Patent Number: 6,127,837
[45] Date of Patent: Oct. 3, 2000

[54] METHOD OF TESTING SEMICONDUCTOR DEVICES

[75] Inventors: Shigehisa Yamamoto; Katsuya Shiga, both of Tokyo, Japan

[73] Assignee: Mitsubishi Denki Kabushiki Kaisha, Tokyo, Japan

[21] Appl. No.: 09/466,932

[22] Filed: Dec. 20, 1999

Related U.S. Application Data

[63] Continuation of application No. 09/129,699, Aug. 5, 1998, Pat. No. 6,037,794.

[30] Foreign Application Priority Data

Mar. 19, 1998 [JP] Japan .................................. p10-69947

[51] Int. Cl.⁷ .................................................. G01R 31/00
[52] U.S. Cl. ........................... 324/765; 324/754; 324/757
[58] Field of Search ..................................... 324/765, 754, 324/757, 758, 762, 158.1

[56] References Cited

U.S. PATENT DOCUMENTS

| | | | |
|---|---|---|---|
| 4,585,991 | 4/1986 | Reid et al. ................................ | 324/757 |
| 5,172,050 | 12/1992 | Swapp ...................................... | 324/752 |
| 5,374,888 | 12/1994 | Karasawa ................................. | 324/765 |
| 5,424,651 | 6/1995 | Green et al. .............................. | 324/754 |
| 5,532,610 | 7/1996 | Tsujide et al. ........................... | 324/757 |
| 5,559,466 | 9/1996 | Sano ......................................... | 324/740 |
| 5,701,666 | 12/1997 | DeHaven et al. .................... | 324/754 X |

*Primary Examiner*—Safet Metjahic
*Attorney, Agent, or Firm*—Oblon, Spivak, McClelland, Maier & Neustadt, P.C.

[57] ABSTRACT

A semiconductor device testing method using a semiconductor device testing apparatus that can improve the contact characteristic between probe needles and power-supply terminals and signal terminals while ensuring efficiency of product utilization of a tested wafer. Provided on a probe wafer (4) are bumps (5) formed in the same positions in mirror symmetry as the positions of pads (3) formed in individual chips (2) on a tested wafer (1), a common interconnection (6) for interconnecting bumps (5) to be supplied with the same power supplies and signals, and terminals (7) connected to the common interconnection (6) to supply power supplies and signals to the common interconnection (6) from the outside. The bumps (5) come in contact with the pads (3) in the chips (2) when the probe wafer (4) and the tested wafer (1) are put together. The common interconnection (6) supplies the power supplies and signals for a burn-in test to the pads (3) in the chips (2).

6 Claims, 11 Drawing Sheets

METHOD OF TESTING SEMICONDUCTOR DEVICES

This application is a continuation of application Ser. No. 09/129,699, filed Aug. 5, 1998, now U.S. Pat. No. 6,037,794 issued Mar. 14, 2000.

BACKGROUND OF THE INVENTION

1. Field of the Invention

The present invention relates to a semiconductor device testing apparatus for applying reliability test to semiconductor devices in wafer form and a semiconductor device testing method using the semiconductor device testing apparatus.

2. Description of the Background Art

Inspections for testing reliability of semiconductor devices including the burn-in test. The burn-in test is one of screening methods for selectively rejecting semiconductor devices that might cause initial failures by operating semiconductor devices under severer stress conditions, including higher voltage, higher temperature, etc., than those in actual use.

Conventionally, a burn-in test is conducted in a constant temperature bath with application of given stress after chips that passed a wafer test following the wafer process have been packaged. Nowadays, however, wafer-level burn-in test is also coming into practice, in which a burn-in test is applied to semiconductor devices in wafer form.

FIG. 17 is a conceptual diagram used to describe a conventional wafer-level burn-in test. A wafer to be tested, 101, has a given pattern of a plurality of chips 102 including semiconductor devices to be inspected. The reference numeral 103 denotes a probe card made of ceramic or the like, which has a plurality of probe needles 104. Power supplies and signals for the burn-in test are supplied to the probe card 103 from an external power supply 127 and an external input signal driver device 126 through interconnection cables 128, and they are supplied further to the chips 102 through the probe needles 104. Temperature stress is applied to the chips 102 from a heater (not shown) in a stage 129 on which the tested wafer 101 is set.

In this case, to collectively supply power supplies and signals to all the chips 102 on the tested wafer 101, it is necessary to equip the probe card 103 with the probe needles 104 of a number corresponding to "the total number of the chips 102X the number of terminals per one chip 102". Accordingly, when the chips 102 have an increased number of power-supply terminals and signal terminals, an enormous number of probe needles 104 are required. Then it is difficult to accurately and uniformly bring the probe needles 104 into contact with all terminals.

When the power supplies and signals are sequentially supplied to each chip 102 in a chip-by-chip manner, instead of being collectively supplied to all the chips 102 on the tested wafer 101, the number of probe needles 104 to be provided on the probe card 103 can be reduced, and then the contact characteristic between the probe needles 104 and the power-supply and signal terminals can be improved. However, applying a burn-in test to all the chips 102 by this method requires a time corresponding to "a time required for a burn-in test to one chip 102X the total number of chips 102". This will reduce the throughput and increase the test cost.

FIG. 18 is a plane view showing the structure of a tested wafer 107 that has been improved to solve such problems, and FIG. 19 is a plane view showing the part XIX in FIG. 18 in an enlarged manner. Similarly to the tested wafer 101, the tested wafer 107 has a plurality of chips 102, each chip 102 having a plurality of power-supply terminals and a plurality of signal terminals. When the chips 102 have some of their power-supply terminals and signal terminals to be supplied with the same power supply and the same signals, these power-supply terminals and signal terminals are interconnected through a common interconnection 106 provided on the tested wafer 107. Then these power-supply terminals and signal terminals can be supplied with power supplies and signals not through the probe needles 104 but through the common interconnection 106. Or, the power supplies and signals may be supplied to the chips 102 through BIST (Built In Self Test) circuits 105 fabricated on the tested wafer 107.

However, this conventional semiconductor device testing apparatus requires areas for formation of the common interconnection 106 or the BIST circuits 105 on the tested wafer 107, which reduces the efficiency of product utilization of the tested wafer 107. That is to say, only a reduced number of chips 102 can be formed on one piece of tested wafer 107.

Further, if the BIST circuits 105 do not normally operate due to some trouble in a burn-in test, the burn-in test cannot be performed. Then the reliability cannot be ensured.

SUMMARY OF THE INVENTION

According to a first aspect of the present invention, a semiconductor device testing method using a semiconductor device testing apparatus for testing a plurality of semiconductor devices arranged on a first main surface of a wafer which comprises: a substrate having a second main surface that faces the first main surface, the second main surface comprising a terminal to which a power supply and a signal for testing the semiconductor devices are supplied from outside, an interconnection having its one end connected to the terminal, and a bump connected to the other end of the interconnection; wherein the bump on the substrate is formed in the same position in mirror symmetry as the position of a pad formed on the semiconductor devices, and the terminal on the substrate is formed in an area in the second main surface that is exposed out of the first main surface when the first main surface and the second main surface face each other with the position of the bump and the position of the pad coinciding with each other. The semiconductor device testing method comprises the steps of:

(a) putting said substrate and said wafer together so that said first main surface and said second main surface face each other with said terminal exposed out of said first main surface; and (b) supplying a power supply and a signal for testing said semiconductor devices to said semiconductor devices from outside through said terminal, said interconnection, said bump, and said pad.

According to a second aspect of the present invention, a semiconductor device testing method using a semiconductor device testing apparatus for testing a plurality of semiconductor devices arranged on a first main surface of a wafer comprises: a substrate having a second main surface that faces the first main surface, the second main surface comprising a terminal to which a power supply and a signal for testing the semiconductor devices are supplied from outside, an interconnection having its one end connected to the terminal, and a bump connected to the other end of the interconnection; wherein the bump on the substrate is formed in the same position in mirror symmetry as the position of a pad formed on the semiconductor devices, and the substrate has connecting means for controlling whether to electrically connect the interconnection and the bump. The semiconductor device testing method comprises the steps of:

(a) putting said substrate and said wafer together so that said first main surface and said second main surface face each other;

(b) not electrically connecting said bump and said interconnection through said connecting means for one of said semiconductor devices that has been determined to be defective in a wafer test performed prior to the test to said semiconductor devices, and electrically connecting said bump and said interconnection through said connecting means for one of said semiconductor devices that passed said wafer test; and (c) supplying a power supply and a signal for testing said semiconductor devices to said semiconductor device which is electrically connected to said bump through said connecting means, through said terminal, said interconnection, said connecting means, said bump, and said pad from outside.

Preferably, according to a third aspect of the present invention, the semiconductor device testing apparatus further comprises a first heater for applying given temperature stress to the semiconductor devices and a second heater for heating the substrate. In the method according to the first aspect of the invention, step (b) is carried out while applying a given temperature stress to said semiconductor devices by said first heater and heating said substrate by said second heater to the same temperature as that of said semiconductor devices heated through the application of said temperature stress.

Preferably, according to a fourth aspect of the present invention, the semiconductor device testing apparatus further comprises hot-air generating means for applying given temperature stress to the semiconductor devices by blowing hot air, and a heater for heating the substrate. In the method according to the first aspect of the invention, step (b) is carried out while applying said given temperature stress to said semiconductor devices by blowing said hot air on said semiconductor devices from said hot-air generating means and heating said substrate by said heater to the same temperature as that of said semiconductor devices that are heated through the application of said temperature stress.

Preferably, according to a fifth aspect of the present invention, the semiconductor device test apparatus further comprises a first heater for applying given temperature stress to the semiconductor devices and a second heater for heating the substrate. In the method according to the second aspect of the invention, step (c) is carried out while applying given temperature stress to said semiconductor devices by said first heater and heating said substrate by said second heater to the same temperature as that of said semiconductor devices heated through the application of said temperature stress.

Preferably, according to a sixth aspect of the present invention, the semiconductor device testing apparatus further comprises hot-air generating means for applying given temperature stress to the semiconductor devices by blowing hot air, and a heater for heating the substrate. In the method according to the second aspect of the present invention, step (c) is carried out while applying said given temperature stress to said semiconductor devices by blowing said hot air on said semiconductor devices from said hot-air generating means and heating said substrate by said heater to the same temperature as that of said semiconductor devices heated through the application of said temperature stress.

According to the third and fifth aspect of the present invention, while the first heater applies temperature stress to the semiconductor devices, the second heater can heat the substrate to the same temperature as the semiconductor devices. This enables good contact between pads on the semiconductor devices and bumps on the substrate. Particularly, this effect is produced remarkably when the wafer and the substrate are made of materials having the same thermal expansion rate.

According to the fourth and sixth aspect of the present invention, while the hot-air generating means blows hot air to the semiconductor devices to apply given temperature stress to the semiconductor devices, the heater heats the substrate to the same temperature as the semiconductor devices heated through the application of temperature stress by the hot-air generating means. This enables good contact between pads on the semiconductor devices and bumps on the substrate. Particularly, this effect is remarkable when the wafer and the substrate are made of materials having the same thermal expansion rate.

Further, even if the surface of the wafer is warped, the hot air blown from the hot-air generating means pressurizes the wafer to eliminate the warp. Hence, good contact between the pads on the semiconductor devices and the bumps on the substrate can be realized over the entire wafer surface.

According to the present invention, a plurality of wafers can be tested at the same time, which improves the throughput and reduces the test cost.

According to the present invention, a plurality of wafers can be tested at the same time easily.

The present invention has been made to solve the problems explained above. A major object of the present invention is to provide a semiconductor device testing method using the testing apparatus that can improve contact characteristic between probe needles and power-supply and signal terminals while ensuring the efficiency of product utilization of a tested wafer.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
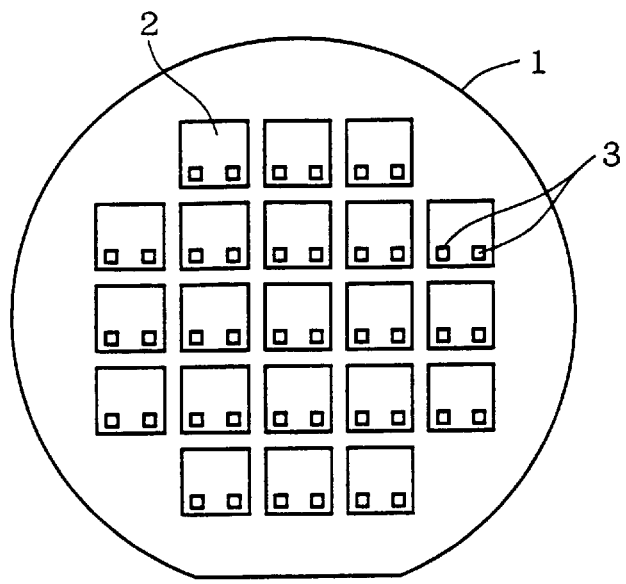
FIG. 1 is a plane view showing the structure of a tested wafer 1 seen from above.

FIG. 1 is a plane view showing the structure of a wafer to be tested, 1, seen from above. The tested wafer 1 has a plurality of chips 2 arranged in a given pattern, which include semiconductor devices to be tested. Each chip 2 has a plurality of terminals for supplying external power supplies and signals for a burn-in test. These terminals are represented as two pads 3 for each chip 2 in FIG. 1.

Figure 2:
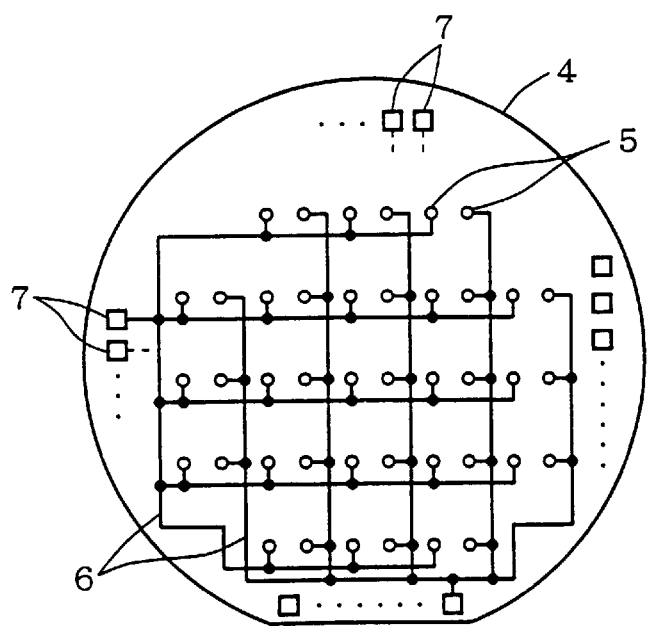
FIG. 2 is a plane view showing the structure of a probe wafer 4 seen from the bottom.

FIG. 2 is a plane view showing the structure of a probe wafer 4 (substrate) seen from the bottom. The probe wafer 4 is formed by using a material having the same thermal expansion rate as the tested wafer 1. The probe wafer 4 has bumps 5 formed in the same positions in mirror symmetry as the pads 3 formed in the chips 2 on the tested wafer 1, a common interconnection 6 for interconnecting corresponding bumps 5 that are to be supplied with common power supplies and signals, and terminals 7 connected to the common interconnection 6 to supply power supplies and signals to the common interconnection 6 from the outside. The bumps 5 have a three-dimensional structure of an electrically conductive material, such as solder. When the probe wafer 4 and the tested wafer 1 are put together with the bottom surface of the probe wafer 4 and the top surface of the tested wafer 1 facing each other, the bumps 5 come in contact with the pads 3 in the chips 2. The common interconnection 6 includes lines for supplying power supplies and signals for the burn-in test to the pads 3 in the chips 2. The common interconnection 6 is made of an electrically conductive material such as aluminum, copper, an alloy thereof, etc., which is formed on the probe wafer 4 by using appropriate semiconductor processes, such as a film forming process like a CVD or sputtering, a transfer process, an etching process, etc. Although FIG. 2 shows the terminals 7 uniformly arranged along the periphery of the probe wafer 4, the terminals 7 may be arranged all together in a part of the bottom surface of the probe wafer 4. Japanese Patent Laying-Open No.6-232226 describes a technique in which a wafer-level burn-in test is performed by using a common interconnection and bumps formed on a semiconductor substrate having a thermal expansion rate close to that of a tested wafer. However, since terminals for supplying power supplies and signals for the burn-in test are formed on the tested wafer in this technique, the efficiency of product utilization of the tested wafer is reduced.

Figure 3:
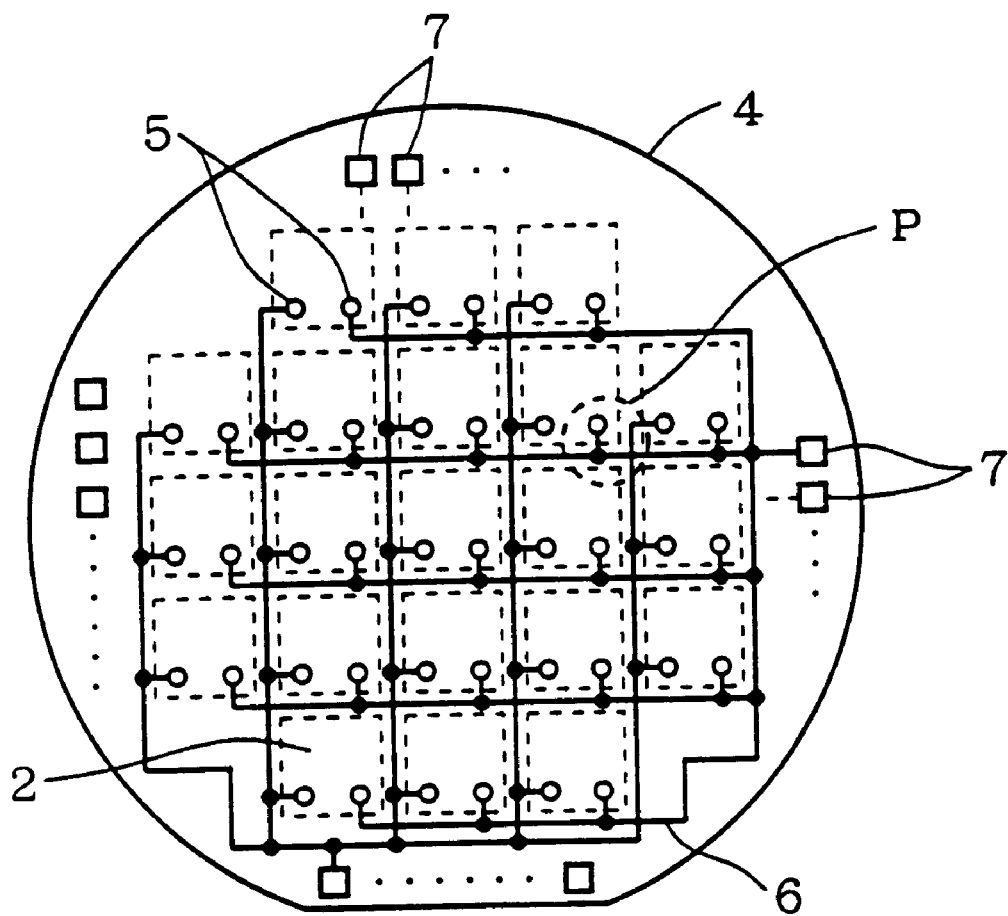
FIG. 3 is a plane view showing the tested wafer 1 and the probe wafer 4 put together.

When performing a wafer-level burn-in test, the tested wafer 1 and the probe wafer 4 are put together so that the top surface of the tested wafer 1 and the bottom surface of the probe wafer 4 face each other with the positions of the bumps 5 and the positions of the pads 3 coinciding with each other. FIG. 3 is a plane view showing the tested wafer 1 and the probe wafer 4 put together in this way. Power supplies and signals for the burn-in test are supplied to the terminals 7 from an external power supply and an external input signal driver device (not shown) through interconnection cables (not shown), and they are supplied further to the pads 3 in the chips 2 through the common interconnection 6 and the bumps 5.

Figure 4:
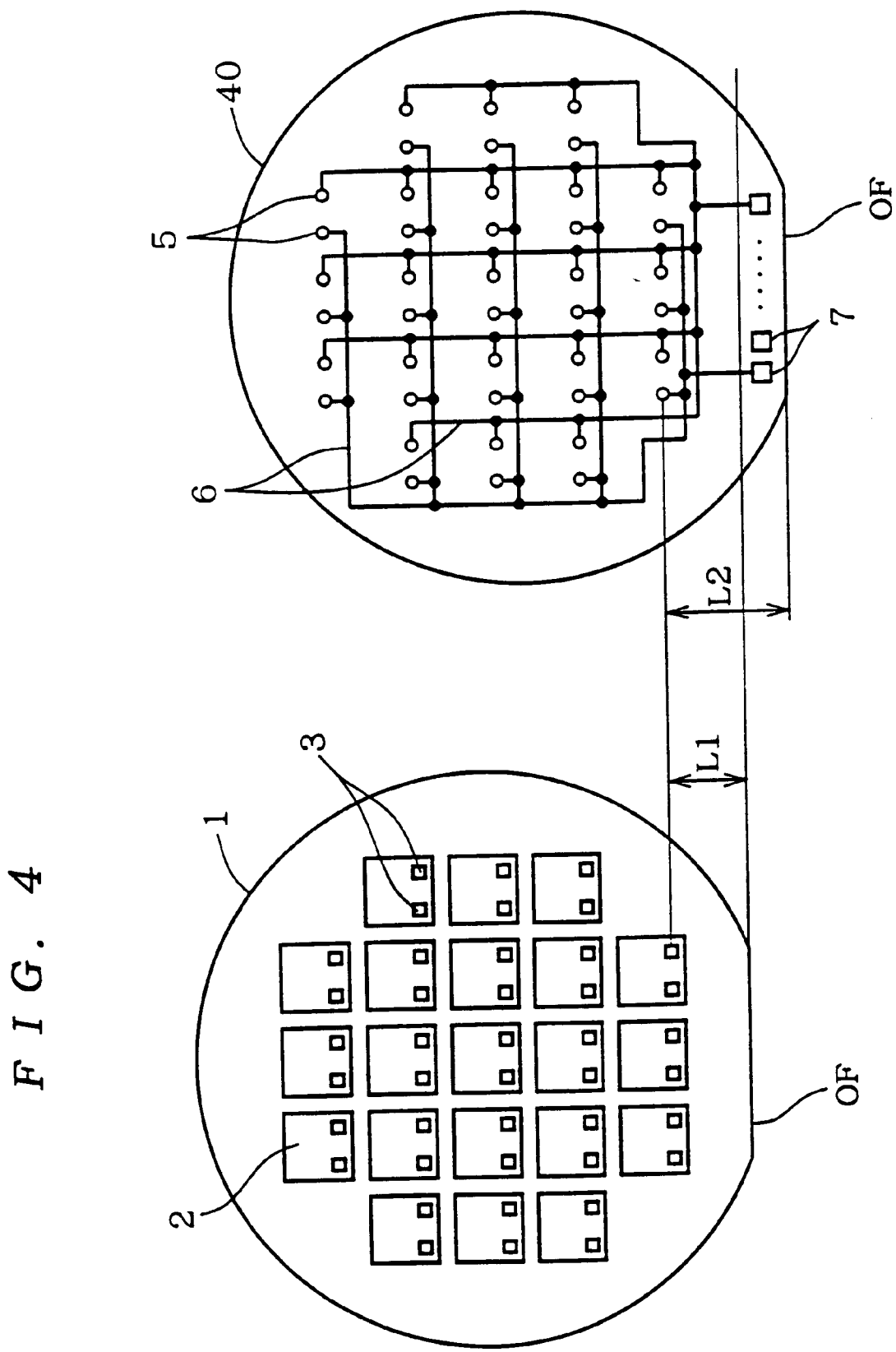
FIG. 4 is a plane view showing the structure of a probe wafer 40 together with the tested wafer 1.

FIG. 4 is a plane view showing the structure of a probe wafer 40, as another example of the probe wafer 4, together with the tested wafer 1. When the distance between a pad 3 in the tested wafer 1 and the periphery of the wafer (e.g., the orientation flat OF) is L1, the common interconnection 6 and the bumps 5 are so arranged on the probe wafer 40 that the distance between the bump 5 corresponding to that pad 3 and the orientation flat OF is L2. The terminals 7 are provided on the wafer surface of the probe wafer 40 in area that is uncovered by the tested wafer 1 when the tested wafer 1 and the probe wafer 40 are put together.

Figure 5:
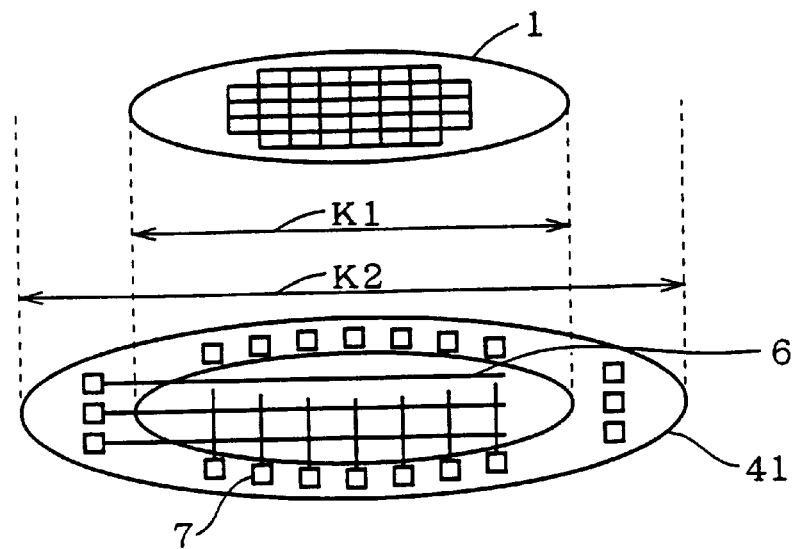
FIG. 5 is a schematic diagram showing the structure of a probe wafer 41 together with the tested wafer 1.

FIG. 5 is a schematic diagram showing the structure of a probe wafer 41, as another example of structure of the probe wafer 4, together with the tested wafer 1. When the diameter of the tested wafer 1 is K1, the diameter of the probe wafer 41 is set to be K2(>K1). Accordingly, when the tested wafer 1 and the probe wafer 41 are put together, some area of the wafer surface of the probe wafer 41 is exposed out of the tested wafer 1. The terminals 7 are formed in such area as is uncovered by the tested wafer 1.

Figure 6:
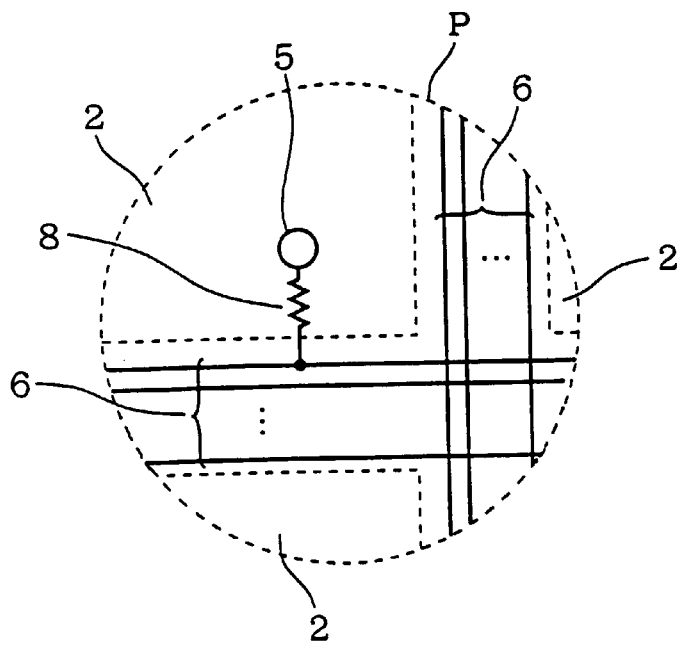
FIG. 6 is a plane view showing a connection between a bump 5 and a common interconnection 6 in an enlarged manner.
Figure 7:
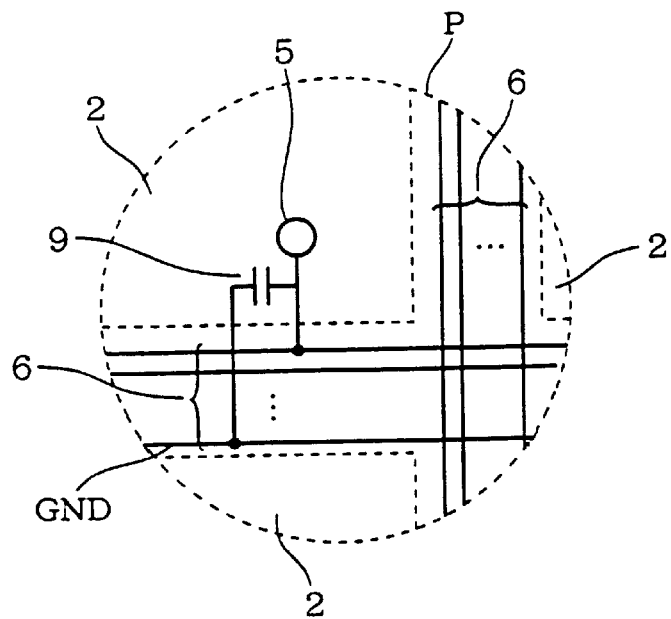
FIG. 7 is a plane view showing a connection between the bump 5 and the common interconnection 6 in an enlarged manner.
Figure 8:
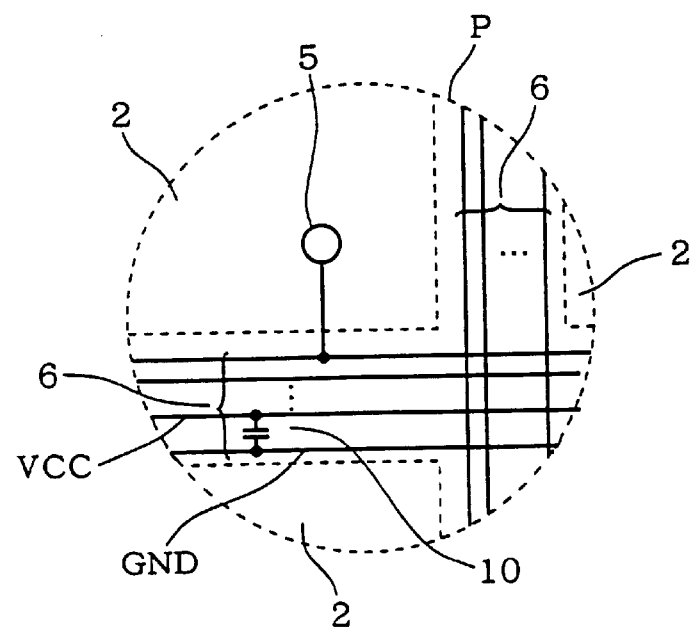
FIG. 8 is a plane view showing a connection between the bump 5 and the common interconnection 6 in an enlarged manner.

FIGS. 6 to 8 are plane views showing a connection between a bump 5 and the common interconnection 6 in an enlarged manner. That is to say, these diagrams show enlarged views of the part P shown in FIG. 3. As shown in FIG. 6, a resistance 8 may be provided between the common interconnection 6 and the bump 5. The resistance 8 can be formed on the probe wafer 4 as a polysilicon interconnection resistance, or a diffused resistance using a $P^+$ diffusion region or an $N^+$ diffusion region, for example. As shown in FIG. 7, a capacitance 9 may be provided between ground GND on the common interconnection 6 and the bump 5. The capacitance 9 can be formed on the probe wafer 4 as a polysilicon interconnection capacitance, an aluminum interconnection capacitance, a diffusion capacitance using a $P^+$ diffusion region or an $N^+$ diffusion region, or as a gate capacitance of a P-channel transistor or an N-channel transistor, for example. This structure prevents overshoot or undershoot of signals supplied to the bump 5 in a burn-in test, and also prevents application of excessive voltage or current to the chip 2. Further, since the resistance 8 or the capacitance 9 is formed not on the tested wafer 1 but on the probe wafer 4, the efficiency of product utilization of the tested wafer 1 is ensured. Japanese Patent Laying-Open No.6-5677 describes a technique of performing a wafer-level burn-in test with a resistance or a capacitance formed between a common interconnection and a bump. However, since the resistance or the capacitance is formed on a tested wafer in this technique, the efficiency of product utilization of the tested wafer is reduced.

Further, as shown in FIG. 8, a capacitance 10 may be provided between the power supply VCC and ground GND on the common interconnection 6. The capacitance 10 can be formed on the probe wafer 4 as a gate capacitance of a P-channel transistor or an N-channel transistor, for example. Connecting the capacitance 10 between the power supply VCC and ground GND in this way prevents noise in the power supply supplied to the bump 5, and avoids input of excessive voltage, current, or external noise to the chip 2. Further, since the capacitance 10 is formed not on the tested wafer 1 but on the probe wafer 4, the efficiency of product utilization of the tested wafer 1 is ensured. The capacitance 10 may be formed together with the resistance 8 or the capacitance 9.

As described above, the common interconnection is formed on the probe wafer in the semiconductor device testing apparatus according to the first preferred embodiment. Accordingly, it is not necessary to prepare an area for formation of the common interconnection on the tested wafer, which improves the contact characteristic between the tested wafer and the probe wafer while ensuring the efficiency of product utilization of the tested wafer.

Moreover, when the terminals 7 are provided in area on the probe wafer that is exposed out of the tested wafer when the probe wafer and the tested wafer are put together, as on the probe wafers 40 and 41, it is possible to easily supply power supplies and signals for a burn-in test to the terminals 7 from the outside.

Second Preferred Embodiment

Figure 9:
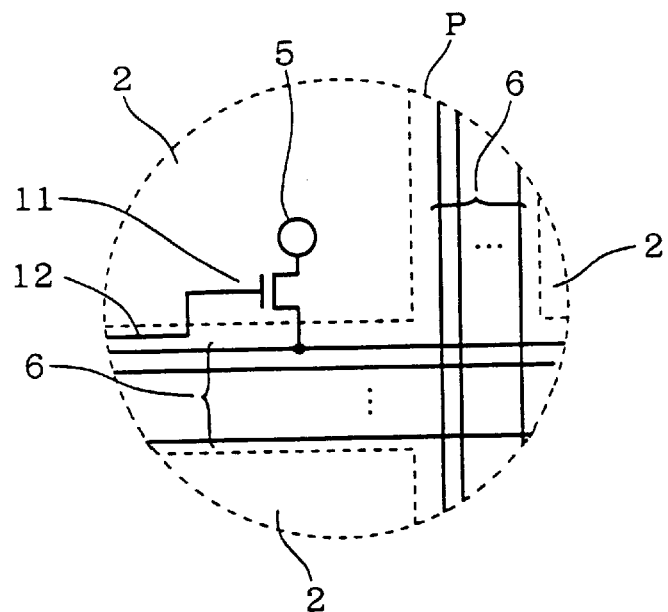
FIG. 9 is a plane view showing a connection between the bump 5 and the common interconnection 6 in an enlarged manner.

FIG. 9 is a plane view showing a connection between a bump 5 and the common interconnection 6 in an enlarged manner. In the second preferred embodiment, a transistor 11 (connecting means) is provided between the common interconnection 6 and the bump 5 as shown in FIG. 9. The transistor 11 has its source connected to the bump 5, its drain connected to the common interconnection 6, and its gate connected to a control signal line 12. The transistor 11 is formed on the probe wafer 4, 40, or 41 by a common semiconductor process. A control signal for the transistor 11 is inputted to the gate of the transistor 11 through the control signal line 12 from an external terminal (not shown), or it may be inputted to the gate of the transistor 11 through the control signal line 12 as an output from an decoder formed on the probe wafer 4.

Power supplies and signals for a burn-in test are inputted to the pad 3 in the chip 2 through the common interconnection 6, the transistor 11, and the bump 5. For example, suppose that the transistor 11 is an N-channel transistor, In this case, when a control signal "H" providing a voltage at or over the operating threshold voltage is inputted to the gate of the transistor 11, the bump 5 and the common interconnection 6 are electrically connected. When a control signal "L" providing a voltage below the operating threshold voltage is inputted, the bump 5 and the common interconnection 6 are not connected electrically. That is to say, it is possible to control whether to supply power supplies and signals for a burn-in test to the chip 2, by inputting a control signal at "H" or "L" to the gate of the transistor 11.

Whether to input a control signal at "H" or "L" to the gate of the transistor 11 is determined in accordance with results of a wafer test. Specifically, when a chip 2 is rejected in the wafer test, a control signal "L" is applied to the gate of the corresponding transistor 11. Then the bump 5 and the common interconnection 6 are not electrically connected, and power supplies and signals for the burn-in test are not inputted to that chip 2. A control signal "H" is inputted to the gate of a transistor 11 corresponding to a chip 2 that passed the wafer test. Then the bump 5 and the common interconnection 6 are electrically connected and power supplies and signals for the burn-in test are supplied to the chip 2.

As described above, according to the semiconductor device testing apparatus of the second preferred embodiment, it is possible to control whether to supply power supplies and signals for a burn-in test to chips, chip to chip, with a control signal inputted to the gates of the transistors. Hence, it is possible not to supply the power supplies and signals to chips that have been rejected in a wafer test. When the signals and the like are supplied to defective chips, an unexpected large current may flow to cause the power supply voltage supplied to acceptable chips to drop, or to cause signal waveforms to be distorted. This preferred embodiment prevents this kind of problems. That is to say, it is possible to apply a normal burn-in test to acceptable chips.

Further, since the transistors are formed not on the tested wafer but on the probe wafer, the efficiency of product utilization of the tested wafer can be ensured.

Third Preferred Embodiment

Figure 10:
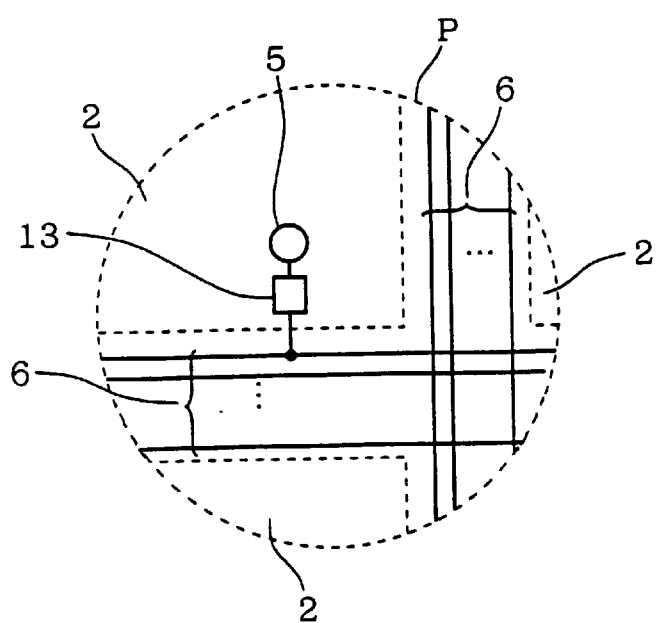
FIG. 10 is a plane view showing a connection between the bump 5 and the common interconnection 6 in an enlarged manner.

FIG. 10 is a plane view showing a connection between a bump 5 and the common interconnection 6 in an enlarged manner. In the third preferred embodiment, an input protect circuit 13 is provided between the common interconnection 6 and the bump 5 as shown in FIG. 10.

Figure 11:
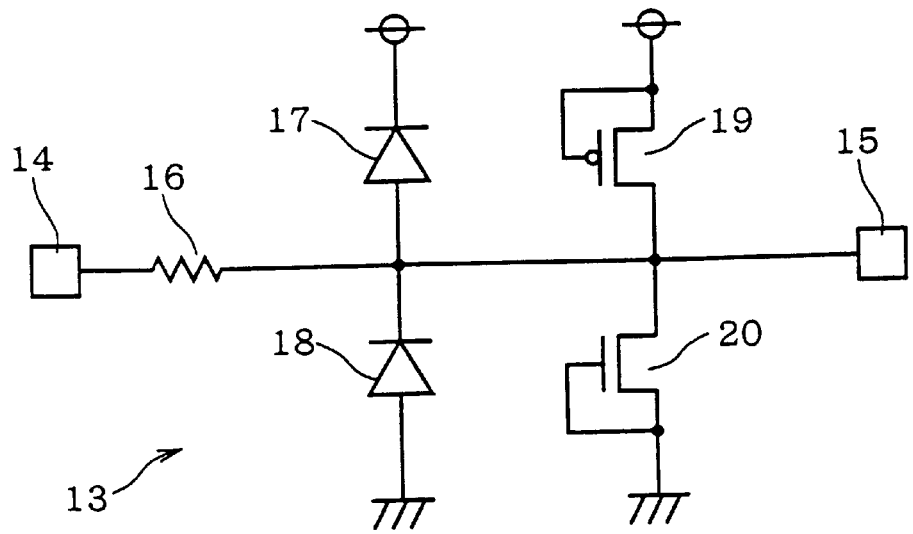
FIG. 11 is a circuit diagram showing a specific structure of an input protect circuit 13.

FIG. 11 is a circuit diagram showing a specific structure of the input protect circuit 13. As the input protect circuit 13, a conventionally used one can be used. FIG. 11 shows an input protect circuit 13 including a resistance 16 formed of polysilicon or diffusion layer, diodes 17, 18, transistors 19, 20, etc. In the input protect circuit 13 shown in FIG. 11, its input terminal 14 is connected to the common interconnection 6 and its output terminal 15 is connected to the bump 5.

Power supplies and signals for a burn-in test are inputted to the pad 3 in the chip 2 through the common interconnection 6, the input protect circuit 13, and the bump 5. Accordingly, even if a surge occurs in the power supply or signal for the burn-in test, it is clamped by the input protect circuit 13 before it reaches the bump 5, which protects the chip 2 from surge breakdown or latchup. It is also possible to prevent breakdown caused by noise when the chip 2 causes a failure in a burn-in test.

As above, according to the semiconductor device testing apparatus of the third preferred embodiment, it is possible to alleviate the problems of overshoot, undershoot, and surge occurring in signals for the burn-in test, so as to prevent application of excessive stresses to the chips. Especially, it produces remarkable effects in a burn-in test to high-speed devices in which input protect circuits cannot be built on the tested wafer.

Further, since the input protect circuits are formed not on the tested wafer but on the probe wafer, the efficiency of product utilization of the tested wafer is ensured.

Fourth Preferred Embodiment

Figure 12:
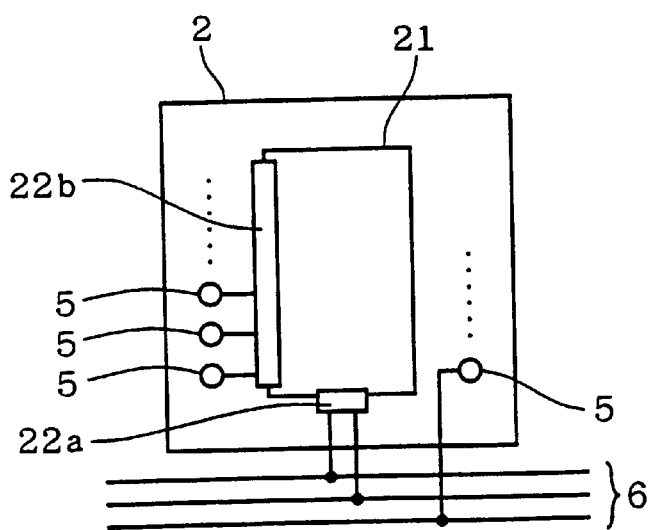
FIG. 12 is a plane view showing a connection between the bump 5 and the common interconnection 6 in an enlarged manner.

FIG. 12 is a plane view showing a connection between bumps 5 and the common interconnection 6 in an enlarged manner. In the fourth preferred embodiment, a BIST circuit 21 is provided between the common interconnection 6 and the bumps 5 as shown in FIG. 12. The BIST circuit 21 is connected to the common interconnection 6 through an input protect circuit 22a and also connected to the bumps 5 through an input protect circuit 22b. A conventional one formed of a signal generating circuit and an output compare circuit etc. (not shown) can be used as the BIST circuit 21, for example.

Power supplies and signals for the burn-in test are inputted to the BIST circuit 21 through the common interconnection 6 and the input protect circuit 22a. The outputs from the BIST circuit 21 are inputted to the pads 3 on the chip 2 through the input protect circuit 22b. At this time, besides the passage through the input protect circuits 22a and 22b and the BIST circuit 21, another passage may be provided for direct input to the pads 3 on the chip 2 from the common interconnection 6 through the bumps 5.

The semiconductor device testing apparatus of the fourth preferred embodiment and the semiconductor device testing apparatus of the second preferred embodiment may be used in combination. That is to say, the transistor 11 is provided between the common interconnection 6 and the input protect circuit 22a. When the output compare circuit in the BIST circuit 21 determines a chip 2 as being defective, a control signal "L" is inputted to the gate of the transistor 11 from the output compare circuit through the control signal line 12. Then the common interconnection 6 and the BIST circuit 21 are disconnected.

As above, according to the semiconductor device testing apparatus of the fourth preferred embodiment, the BIST circuit is provided not on the tested wafer but on the probe wafer. When a BIST circuit is fabricated on the tested wafer, it cannot be equipped with a sufficient function, because reduction in the number of chips is undesirable. On the other hand, when the BIST circuit is fabricated on the probe wafer as shown in the fourth preferred embodiment, it can be fabricated in an area as large as each chip area on the probe wafer, which allows the BIST circuit to be equipped with a sufficient function for the burn-in test. This further reduces the number of probe needles to be mounted on the probe wafer.

Particularly, it produces remarkable effects in a burn-in test to high-speed devices in which the input protect circuits cannot be built on the tested wafer.

Fifth Preferred Embodiment

Figure 13:
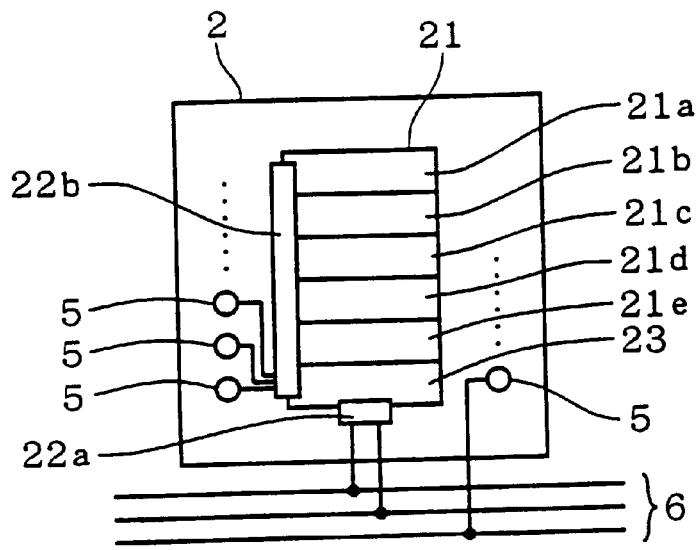
FIG. 13 is a plane view showing a connection between the bump 5 and the common interconnection 6 in an enlarged manner.

FIG. 13 is a plane view showing a connection between bumps 5 and the common interconnection 6 in an enlarged manner. It is basically the same as that shown in the fourth preferred embodiment. However, it is different from it in that the BIST circuit 21 includes a plurality of BIST circuits 21a to 21e, and that it includes a selector 23 for selecting one of the plurality of BIST circuits 21a to 21e and connecting the selected one to the input protect circuit 22b. As can be clearly seen from FIG. 13, the BIST circuits 21a to 21e and the selector 23 are formed on the probe wafer 4, 40, or 41.

The selector 23 selects one BIST circuit out of the plurality of BIST circuits 21a to 21e by using a conventional majority logic circuit, or a BIST circuit and the input protect circuit 22b are physically connected by using a fuse or the like. For example, suppose that the BIST circuit 21a is connected to the input protect circuit 22b in the first place. If the BIST circuit 21a goes wrong in an initial stage in fabrication of the probe wafer 4, 40, or 41 or in the process of the burn-in test, the selector 23 selects the BIST circuit 21b.

As above, according to the semiconductor device testing apparatus of the fifth preferred embodiment, a plurality of BIST circuits are provided on a probe wafer, so that even if a BIST circuit causes a failure in a burn-in test, the selector can switch to a normal BIST circuit to continue the burn-in test normally.

It remarkably produces its effects particularly in a burn-in test for high-speed devices in which the input protect circuitry cannot be fabricated on the tested wafer.

Since the plurality of BIST circuits and the selector are formed not on the tested wafer but on the probe wafer, the efficiency of product utilization of the tested wafer can be ensured.

Sixth Preferred Embodiment

Figure 14:
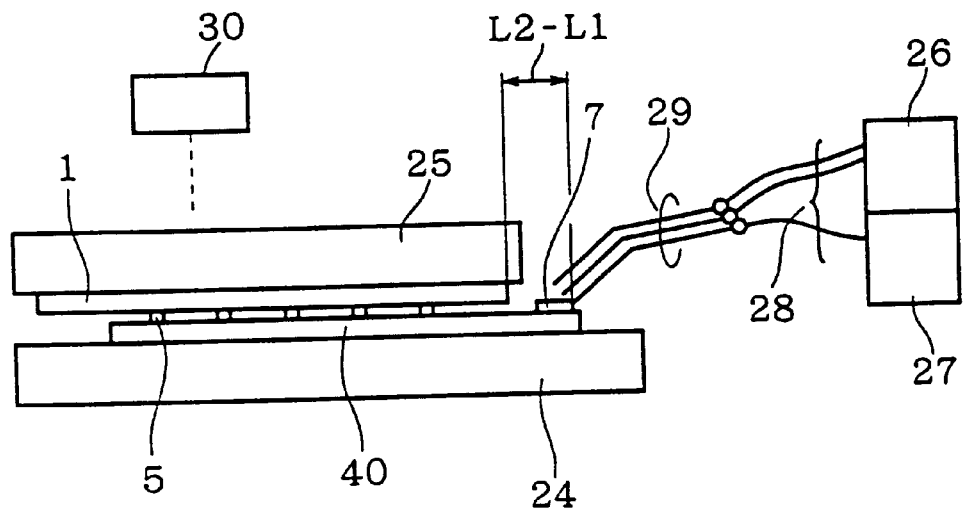
FIG. 14 is a side view showing the structure of a semiconductor device testing apparatus according to a sixth preferred embodiment of the present invention.

FIG. 14 is a side view showing the structure of a semiconductor device testing apparatus according to a sixth preferred embodiment of the present invention. In FIG. 14, the numeral 24 shows a stage for supporting the probe wafer 40, and the numeral 25 shows a stage for supporting the tested wafer 1. The stage 24 and the stage 25 each have a heater (not shown). An external input signal driver device 26 and an external power supply 27 are connected to the terminals 7 on the probe wafer 40 through interconnection cables 28 and conductors 29, e.g., probe needles. It is seen that the probe wafer 40 described in the first preferred embodiment is used here as the probe wafer and the terminals 7 are exposed out of the tested wafer 1 so that the conductors 29 and the terminals 7 can be easily connected. The numeral 30 denotes a wafer position detector 30 for positioning the tested wafer 1 and the probe wafer 40. It is formed of a conventionally used infrared detector, for example. More specifically, the tested wafer 1 and the probe wafer 40 are positioned with respect to each other so that the pads 3 on the chips 2 and the bumps 5 on the probe wafer 40 come in contact with each other.

Given temperature stress for a burn-in test is applied to the tested wafer 1 from a heater installed in the stage 25. The heater in the stage 24 heats the probe wafer 40 to the temperature equivalent to the temperature stress mentioned above.

Although the probe wafer 40 is used as the probe wafer in the description above, the probe wafer 41, or the probe wafer 4 shown in the first preferred embodiment may be used instead.

As above, according to the semiconductor device testing apparatus of the sixth preferred embodiment, heaters in the stages 24 and 25 heat the tested wafer and the probe wafer to the same temperature to realize good contact between the pads on the chips and the bumps on the probe wafer. The effect is produced remarkably especially when the tested wafer and the probe wafer are made of materials having the same thermal expansion rate.

Seventh Preferred Embodiment

Figure 15:
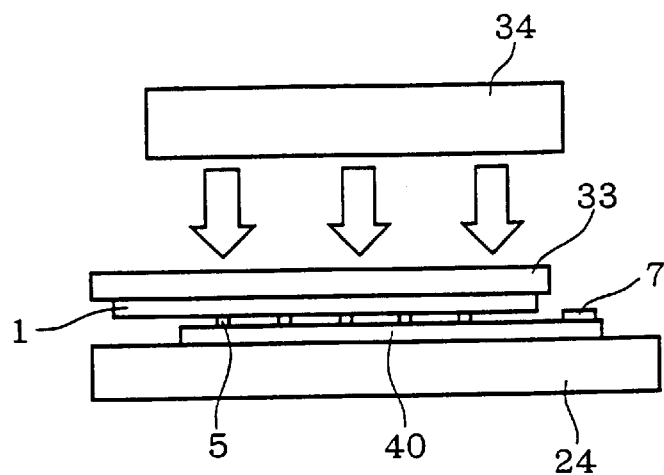
FIG. 15 is a side view showing the structure of a semiconductor device testing apparatus according to a seventh preferred embodiment of the present invention.

FIG. 15 is a side view showing the structure of a semiconductor device testing apparatus according to a seventh preferred embodiment of the present invention. In FIG. 15, the reference numeral 33 denotes a supporting frame for supporting the tested wafer 1 and 34 shows a hot-air generator. After the tested wafer 1 supported by the supporting frame 33 and the probe wafer 40 supported by the stage 24 are set in their positions, the supporting frame 33 is separated from the tested wafer 1 to expose the bottom surface of the tested wafer 1. Then a hot wind is blown to the bottom surface of the tested wafer 1 from the hot-air generator 34. Given temperature stress is thus applied to the tested wafer 1 by the hot wind blown from the hot-air generator 34. Similarly to the sixth preferred embodiment, the heater in the stage 24 heats the probe wafer 40 to the same temperature as the tested wafer 1.

As described above, according to the semiconductor device testing apparatus of the seventh preferred embodiment, while given temperature stress is applied to the tested wafer by blowing a hot wind from the hot-air generator, the probe wafer can be heated to the same temperature as the tested wafer by a heater in the stage. This enables good contact between the pads in the chips and the bumps formed on the probe wafer.

Further, the hot wind also applies pressure to the tested wafer. For example, when the tested wafer is a large-area wafer having its surface warped, the pressure applied by the hot wind eliminates the warp. Accordingly, it is possible to realize good contact between the pads on the chips and the bumps on the probe wafer all over the wafer surface.

Eighth Preferred Embodiment

Figure 16:
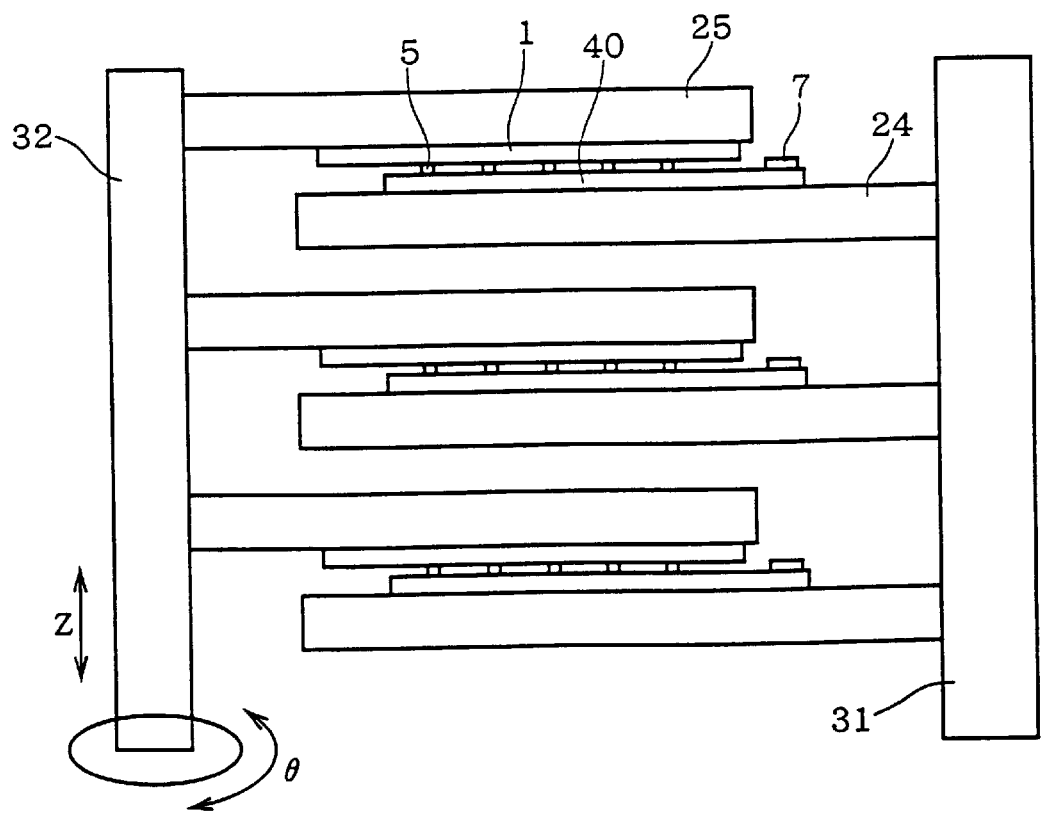
FIG. 16 is a side view showing the structure of a semiconductor device testing apparatus according to an eighth preferred embodiment of the present invention.
Figure 17:
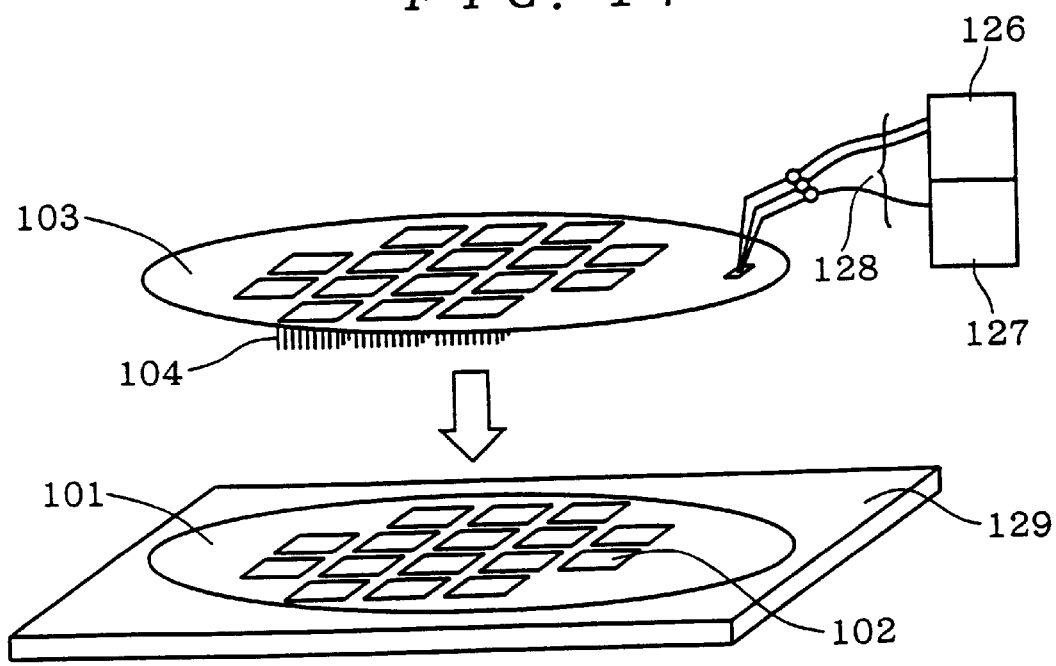
FIG. 17 is a conceptual diagram used to describe a conventional wafer-level burn-in test.
Figure 18:
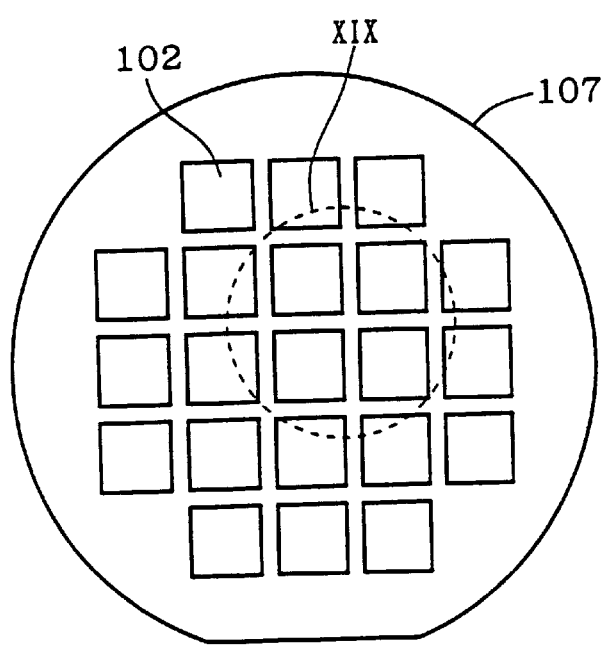
FIG. 18 is a plane view showing the structure of a tested wafer 107.
Figure 19:
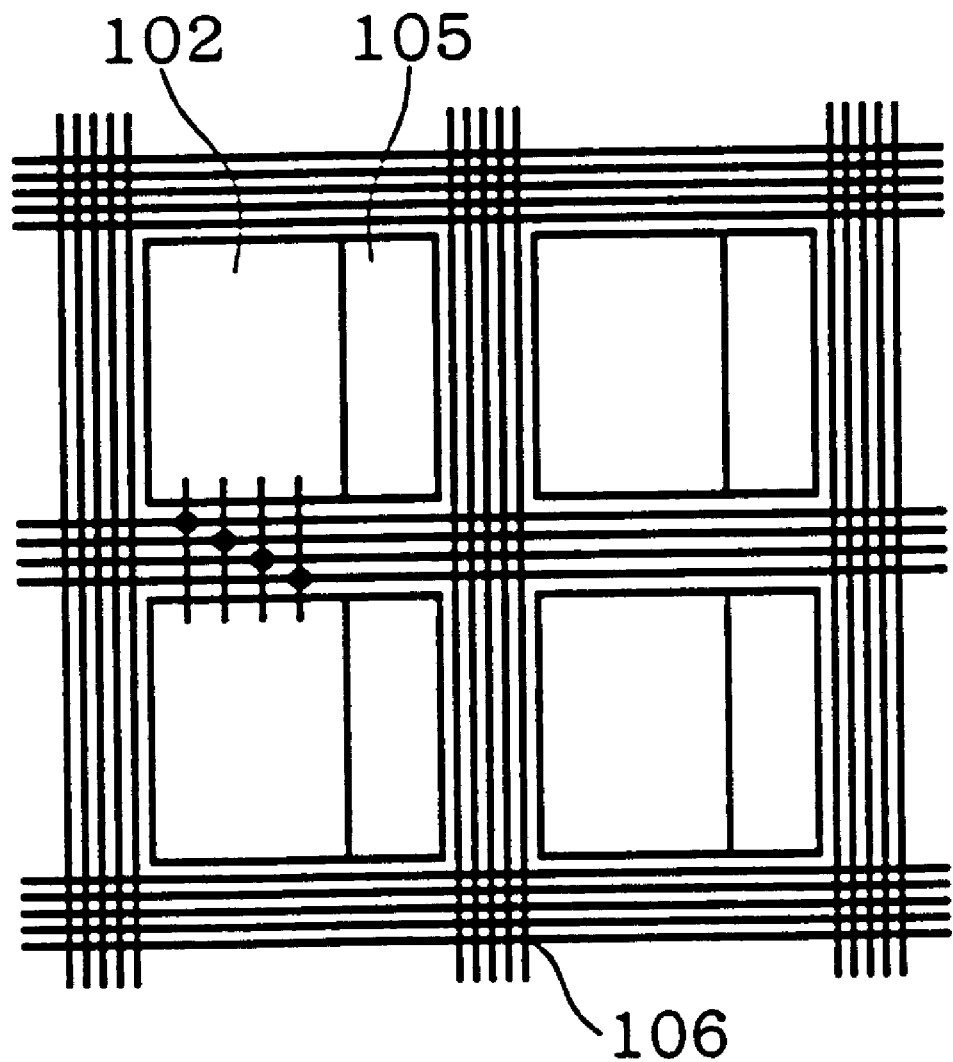
FIG. 19 is a plane view showing the part XIX in FIG. 18 in an enlarged manner.

FIG. 16 is a side view showing the structure of a semiconductor device testing apparatus according to an eighth preferred embodiment of the present invention. The semiconductor device testing apparatus of the eighth preferred embodiment enables a burn-in test to be applied simultaneously to a plurality of tested wafers 1.

A plurality of stages 24 are fixed on a shaft 31 and a plurality of stages 25 are fixed on a shaft 32. At least one of the shaft 31 and the shaft 32 is movable in the direction Z and the direction θ shown in FIG. 16.

For example, the tested wafers 1 and the probe wafers 40 are positioned with respect to each other by turning the shaft 32 in the direction θ and moving it up and down in the direction Z.

In the description above, the stages 24 and the stages 25 are fixed respectively on the shaft 31 and the shaft 32, with at least one of the shaft 31 and the shaft 32 being moved in the direction Z and the direction θ. However, any structure can be used as long as it allows the stages 24 and the stages 25 to be moved relatively to each other to position the tested wafers 1 and the probe wafers 40.

As described above, according to the semiconductor device testing apparatus of the eighth preferred embodiment, a burn-in test can be applied simultaneously to a plurality of tested wafers to improve the throughput and reduce the test cost.

Further, since the system is constructed in the longitudinal direction (the direction Z), the area occupied by the testing apparatus itself is not increased.

While the invention has been described in detail, the foregoing description is in all aspects illustrative and not restrictive. It is understood that numerous other modifications and variations can be devised without departing from the scope of the invention.

We claim:

1. A semiconductor device testing method using a semiconductor device testing apparatus for testing a plurality of semiconductor devices arranged on a first main surface of a wafer, said semiconductor device testing apparatus comprising:
a substrate having a second main surface that faces said first main surface, said second main surface comprising a terminal to which a power supply and a signal for testing said semiconductor devices are supplied from outside, an interconnection having its one end connected to said terminal, and a bump connected to the other end of said interconnection, said bump on said substrate being formed on the same position in mirror symmetry as the position of a pad formed on said semiconductor devices, said terminal on said substrate being formed in an area of said second main surface that is exposed out of said first main surface when said first main surface and said second main surface face each other with the position of said bump and the position of said pad coinciding with each other, said semiconductor device testing method comprising the steps of:
(a) putting said substrate and said wafer together so that said first main surface and said second main surface face each other with said terminal exposed out of said first main surface; and
(b) supplying a power supply and a signal for testing said semiconductor devices to said semiconductor devices from outside through said terminal, said interconnection, said bump, and said pad.

2. The semiconductor device testing method according to claim 1, wherein:

said semiconductor device testing apparatus further comprises a first heater for applying given temperature stress to said semiconductor devices and a second heater for heating said substrate; and said step (b) is carried out while applying a given temperature stress to said semiconductor devices by said first heater and heating said substrate by said second heater to the same temperature as that of said semiconductor devices heated through the application of said temperature stress.

3. The semiconductor device testing method according to claim 1, wherein:

said semiconductor device testing apparatus further comprises hot-air generating means for applying a given temperature stress to said semiconductor devices by blowing hot air, and a heater for heating said substrate; and said step (b) is carried out while applying said given temperature stress to said semiconductor devices by blowing said hot air on said semiconductor devices from said hot-air generating means and heating said substrate by said heater to the same temperature as that of said semiconductor devices that are heated through the application of said temperature stress.

4. A semiconductor device testing method using a semiconductor device testing apparatus for testing a plurality of semiconductor devices arranged on a first main surface of a wafer, said semiconductor device testing apparatus comprising a substrate having a second main surface that faces said first main surface, said second main surface comprising a terminal to which a power supply and a signal for testing said semiconductor devices are supplied from outside, an interconnection having its one end connected to said terminal, and a bump connected to the other end of said interconnection, said bump on said substrate being formed on the same position in mirror symmetry as the position of a pad formed on said semiconductor devices, said substrate having connecting means for controlling whether to electrically connect said interconnection and said bump, said semiconductor device testing method comprising the steps of:
- (a) putting said substrate and said wafer together so that said first main surface and said second main surface face each other;
- (b) not electrically connecting said bump and said interconnection through said connecting means for one of said semiconductor devices that has been determined to be defective in a wafer test performed prior to the test to said semiconductor devices, and electrically connecting said bump and said interconnection through said connecting means for one of said semiconductor devices that passed said wafer test; and
- (c) supplying a power supply and a signal for testing said semiconductor devices to said semiconductor device which is electrically connected to said bump through said connecting means, through said terminal, said interconnection, said connecting means, said bump, and said pad from outside.

5. The semiconductor device testing method according to claim 4, wherein:

said semiconductor device testing apparatus further comprises a first heater for applying given temperature stress to said semiconductor devices and a second heater for heating said substrate; and said step (c) is carried out while applying given temperature stress to said semiconductor devices by said first heater and heating said substrate by said second heater to the same temperature as that of said semiconductor devices heated through the application of said temperature stress.

6. The semiconductor device testing method according to claim 4, wherein:

said semiconductor device testing apparatus further comprises a hot-air generating means for applying given temperature stress to said semiconductor devices by blowing hot air, and a heater for heating said substrate; and said step (c) is carried out while applying said given temperature stress to said semiconductor devices by blowing said hot air on said semiconductor devices from said hot-air generating means and heating said substrate by said heater to the same temperature as that of said semiconductor devices heated through the application of said temperature stress.

* * * * *